US005300443A

United States Patent [19]
Shimabukuro et al.

[11] Patent Number: 5,300,443
[45] Date of Patent: Apr. 5, 1994

[54] METHOD FOR FABRICATING COMPLEMENTARY ENHANCEMENT AND DEPLETION MODE FIELD EFFECT TRANSISTORS ON A SINGLE SUBSTRATE

[75] Inventors: Randy L. Shimabukuro; Michael E. Wood; Oswald I. Csanadi, all of San Diego, Calif.

[73] Assignee: The United States of America as represented by the Secretary of the Navy, Washington, D.C.

[21] Appl. No.: 94,541

[22] Filed: Jun. 30, 1993

[51] Int. Cl.$^5$ ............................................. H01L 21/265
[52] U.S. Cl. ............................................. 437/34; 437/51; 437/56; 437/57; 437/979; 148/DIG. 82; 148/DIG. 150
[58] Field of Search .................... 437/34, 45, 51, 56, 437/57, 58, 59, 979, 228; 148/DIG. 82, DIG. 150

[56] References Cited

U.S. PATENT DOCUMENTS

| | | | |
|---|---|---|---|
| 4,002,501 | 1/1977 | Tamura | 148/DIG. 150 |
| 4,385,937 | 5/1983 | Ohmura | 437/56 |
| 4,395,726 | 7/1983 | Maeguchi | 357/41 |
| 4,682,055 | 7/1987 | Upadhyayula | 307/451 |
| 4,816,893 | 3/1989 | Mayer et al. | 357/42 |
| 5,024,965 | 6/1991 | Chang et al. | 437/57 |
| 5,245,207 | 7/1993 | Mikoshiba et al. | 257/392 |

*Primary Examiner*—Brian E. Hearn
*Assistant Examiner*—Tuan Nguyen
*Attorney, Agent, or Firm*—Harvey Fendelman; Thomas Glenn Keough; Michael A. Kagan

[57] ABSTRACT

A method for fabricating complementary enhancement and depletion mode field effect transistors on a single substrate comprises the steps of: a) patterning a structure of a layer of silicon formed on an insulating substrate to form first, second, third, and fourth silicon islands; b) doping the second island with a p-type dopant; c) doping the third island with a p-type dopant; d) doping the fourth island with an n-type dopant; e) forming a first electrically insulating gate layer on the third and fourth islands; f) forming a second electrically insulating gate on the first and second islands; g) forming an electrically conductive gate over the first and second electrically insulating gate layers; h) doping the second island with an n-type dopant; i) doping the fourth island with an n-type dopant; j) doping the first and third islands with a p-type dopant; and k) doping the first and third islands with a p-type dopant to transform the first island into a p-type enhancement mode field effect transistor, the second island into a n-type enhancement mode field effect transistor, the third island into a p-type depletion mode field effect transistor, and the fourth island into an n-type depletion mode field effect transistor.

34 Claims, 6 Drawing Sheets

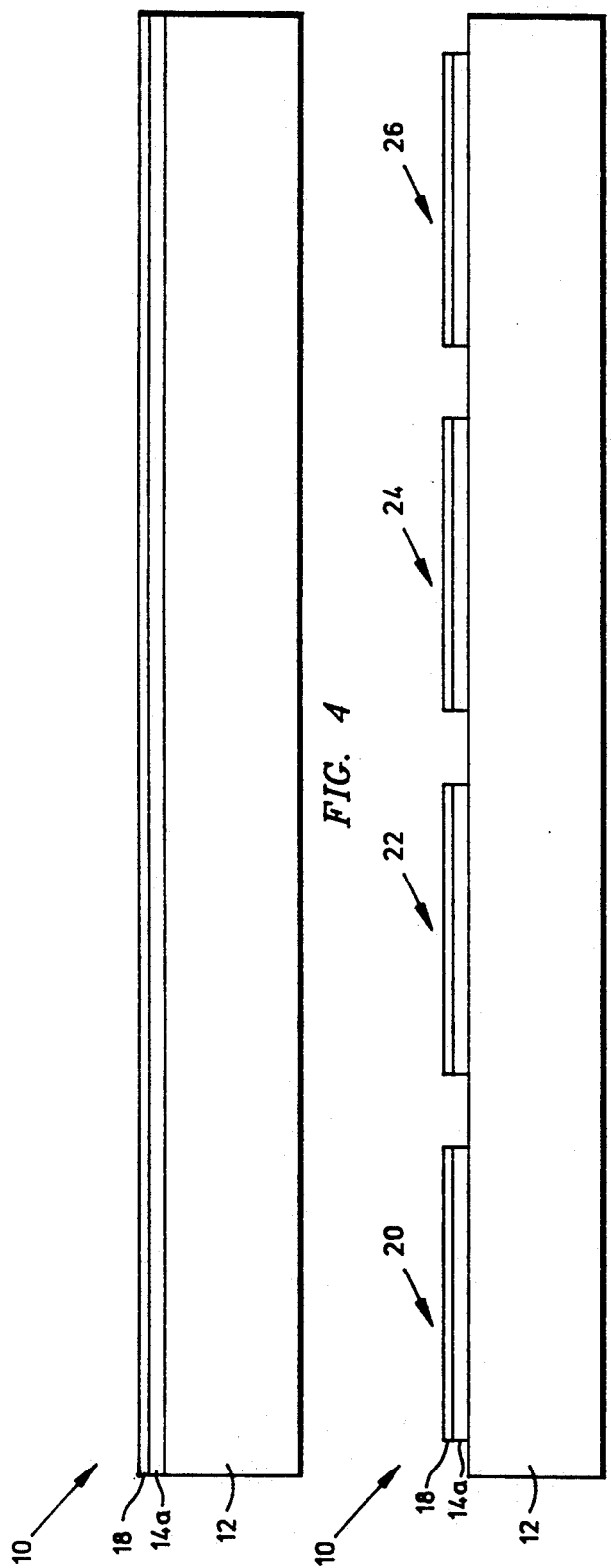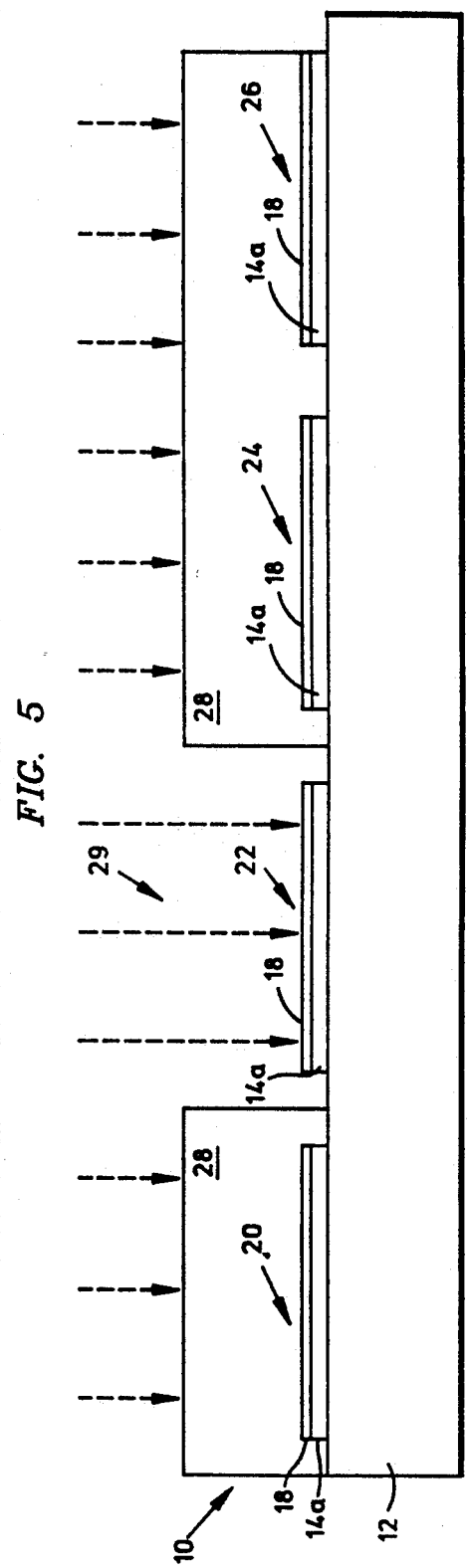

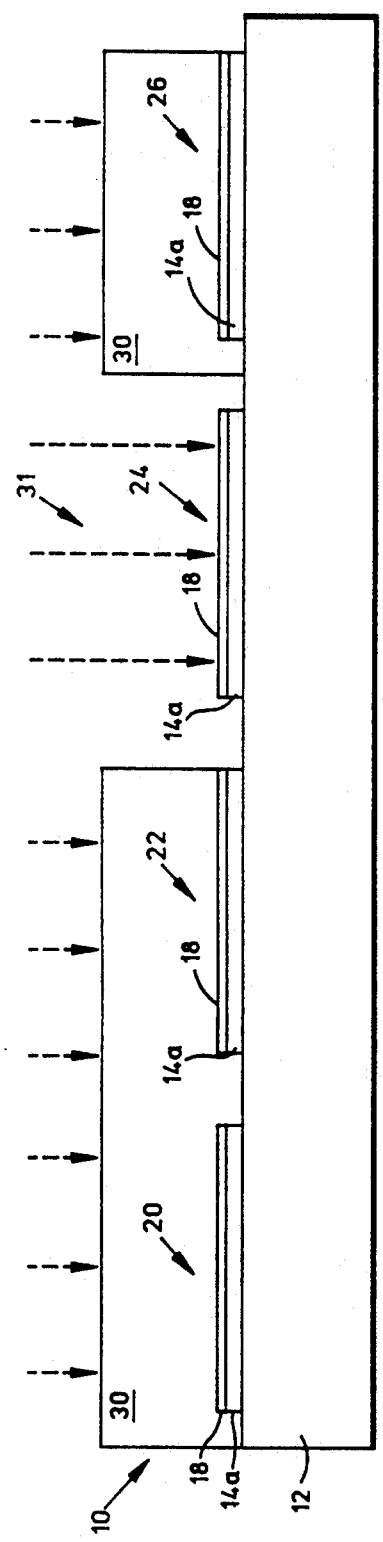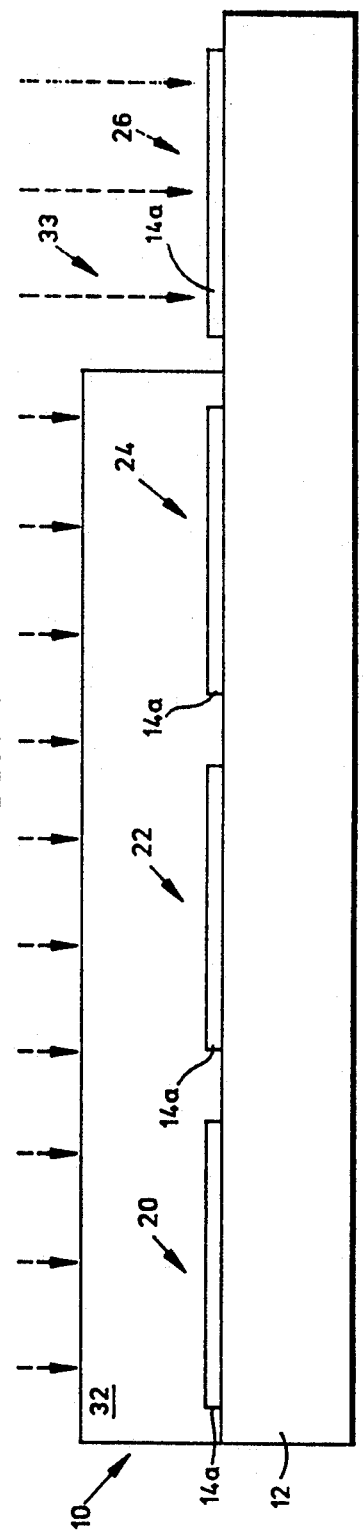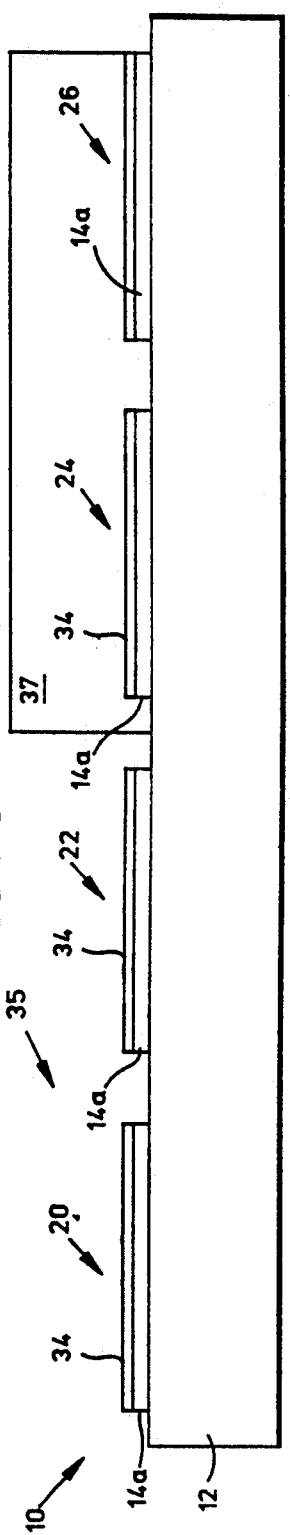

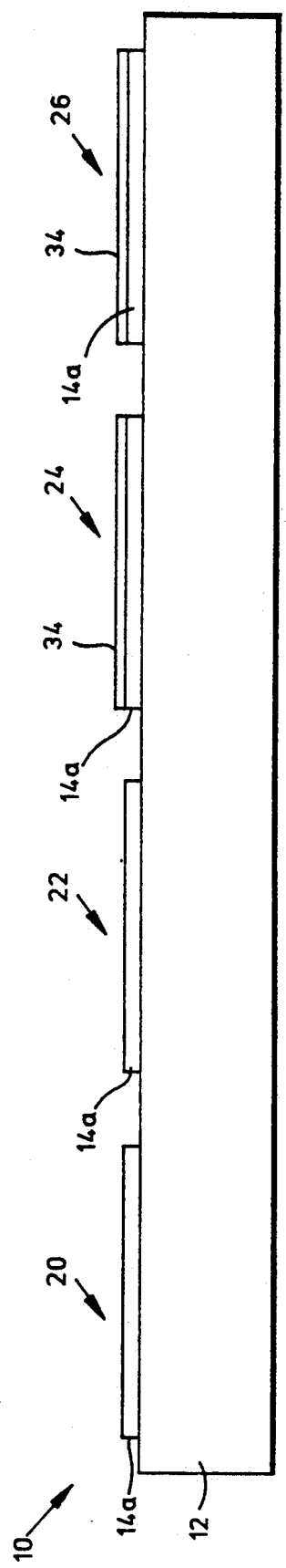
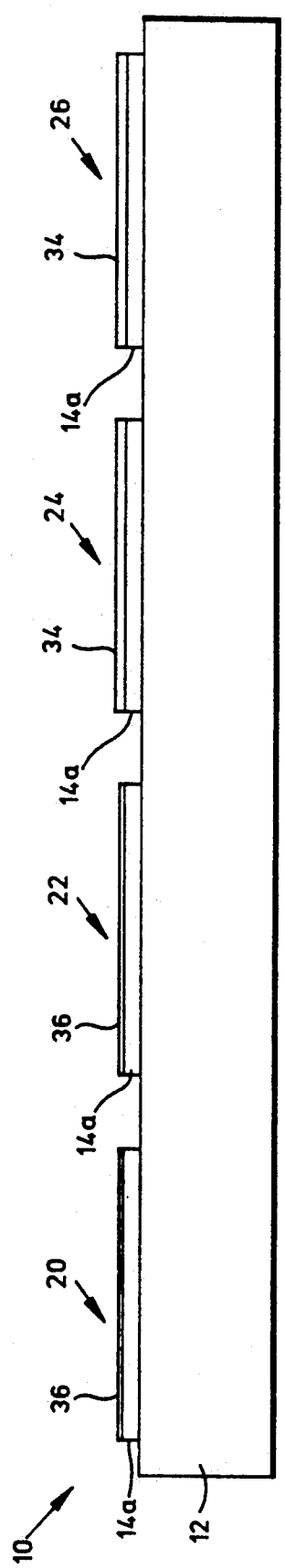
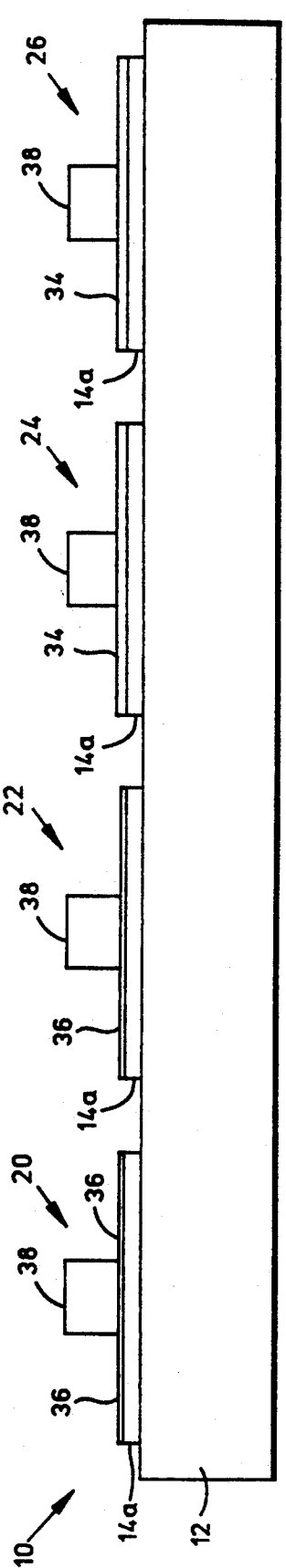
FIG. 10
FIG. 11
FIG. 12

METHOD FOR FABRICATING COMPLEMENTARY ENHANCEMENT AND DEPLETION MODE FIELD EFFECT TRANSISTORS ON A SINGLE SUBSTRATE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of MOSFET's, and more particularly to a method for fabricating complementary enhancement and high threshold depletion mode field effect transistors on a single substrate.

Devices such as are taught in U.S. Pat. No. 5,027,171, "Dual Polarity MOS Analog Memory Device," and U.S. Pat. No. 5,097,156, "Compensation Circuitry for Analog Multiplier" employ both enhancement and high threshold depletion mode transistors in analog integrated circuits. The operational characteristics of the two types of devices are sufficiently different that their fabrication generally requires incompatible processing steps. For example, high transconductance of the enhancement mode transistors is generally desirable in applications such as amplifier circuits, while high threshold characteristics for depletion mode transistors are desirable in applications such as analog multipliers. To maximize the transconductance, the thickness of the insulating gate layer of the enhancement mode device is minimized, whereas to achieve the maximum threshold voltage, the thickness of the insulating gate layer of a depletion mode device is relatively high. In order to fabricate depletion and enhancement mode transistors on a single substrate, conventional MOSFET fabrication techniques would normally result in a single gate oxide thickness that would not produce depletion and enhancement transistors having optimal performance characteristics. Because there are applications requiring the use of both such transistors, there is therefore, a need for a method for manufacturing complementary depletion and enhancement mode transistors on a single substrate.

DESCRIPTION OF THE DRAWINGS

FIGS. 1-16 illustrate various process steps for fabricating complementary depletion and enhancement mode field effect transistors on a single substrate in accordance with the method of the present invention.

SUMMARY OF THE INVENTION

Figure 1:
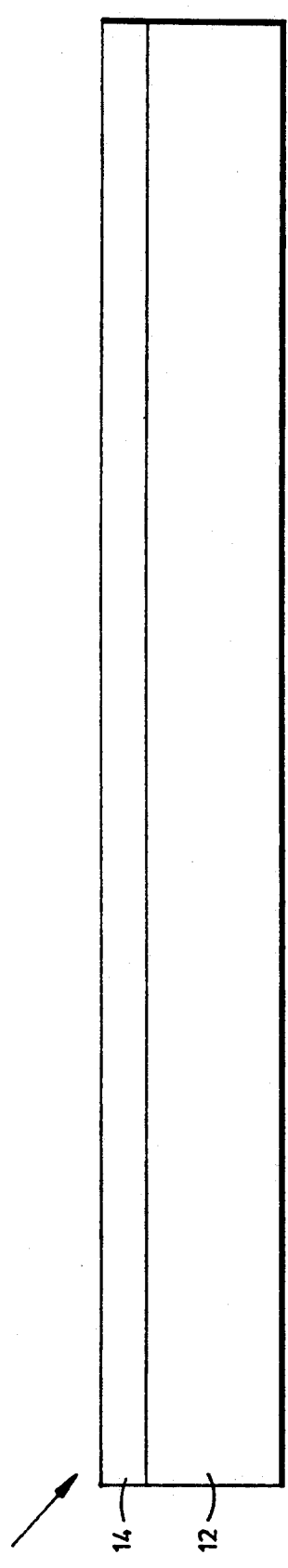

The present invention provides a method for fabricating complementary enhancement and depletion mode field effect transistors on a single substrate. The method comprises the steps of: a) patterning a structure of a layer of silicon formed on an insulating substrate to form first, second, third, and fourth silicon islands; b) doping the second island with a p-type dopant; c) doping the third island with a p-type dopant; d) doping the fourth island with an n-type dopant; e) forming a first electrically insulating gate layer on the third and fourth islands; f) forming a second electrically insulating gate layer on the first and second islands; g) forming an electrically conductive gate over the first and second electrically insulating gate layers; h) doping the second island with an n-type dopant; i) doping the fourth island with an n-type dopant; j) doping the first and third islands with a first p-type dopant; and k) doping the first and third islands with a second p-type dopant to transform the first island into a p-type enhancement mode field effect transistor, the second island into an n-type enhancement mode field effect transistor, the third island into a p-type depletion mode field effect transistor, and the fourth island into an n-type depletion mode field effect transistor.

In another aspect of the invention, the method comprises the steps of: a) patterning a structure of a layer of silicon formed on an insulating substrate to form first, second, third, and fourth silicon islands; b) doping the second island with a p-type dopant; c) doping the third island with a p-type dopant; d) doping the fourth island with an n-type dopant; e) forming a first electrically insulating gate layer on the third and fourth islands; f) forming a second electrically insulating gate layer on the first and second islands; g) forming an electrically conductive gate over the first and second electrically insulating gate layers; h) doping the second island with an n-type dopant at a first energy level and at a first dose; i) doping the fourth island with an n-type dopant at a second energy level and at a second dose; j) doping the first island with a p-type dopant at a third energy level and at a third dose; k) doping the third island with a p-type dopant at a fourth energy level and at a fourth dose; and l) annealing the wafer to transform the first island into a p-type enhancement mode field effect transistor, the second island into an n-type enhancement mode field effect transistor, the third island into a p-type enhancement mode field effect transistor, the fourth island into an n-type depletion mode field effect transistor, and the fourth island into an n-type depletion mode field effect transistor.

The method of the present invention may be advantageously employed to fabricate devices such as those described in U.S. Pat. No. 5,027,171 "Dual Polarity MOS Analog Memory Device," and U.S. Pat. No. 5,097,156, "Compensation Circuitry For Analog Multiplier." The method may also be used to fabricate complementary depletion and enhancement mode field effect transistors on a single substrate which may be used in circuits other than those described in the above referenced patents.

An important advantage of the present invention is that it provides a method for fabricating depletion mode MOSFET's having large threshold voltages, and enhancement mode MOSFET's having high transconductance on the same substrate by formation of insulating gate layers having thicknesses appropriate for realizing these characteristics. A further advantage of the present invention is that such MOSFET's may be formed using improved silicon-on-sapphire material which facilitates the fabrication of depletion mode transistors by providing good control of the channel depth.

DESCRIPTION OF THE PREFERRED EMBODIMENT

Figure 2:
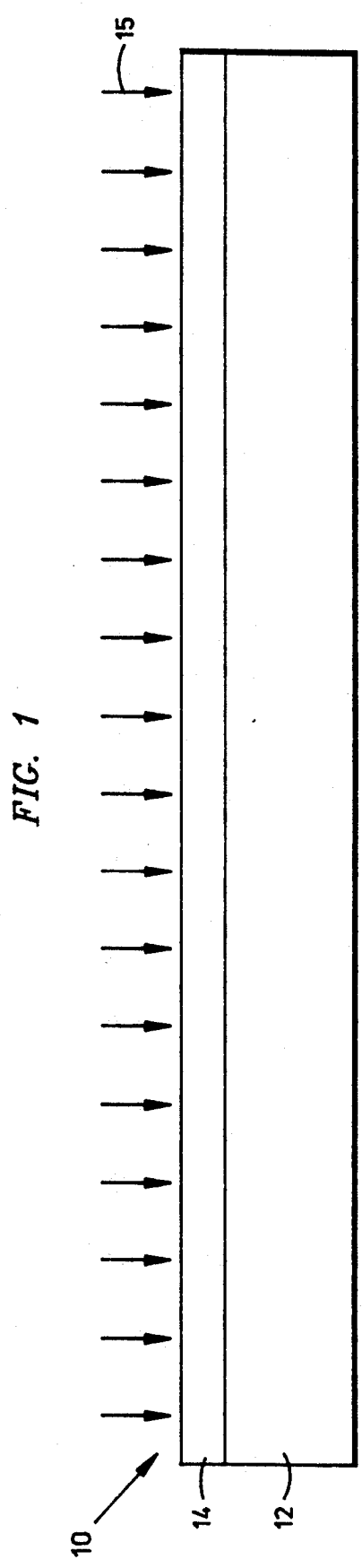
Figure 3:
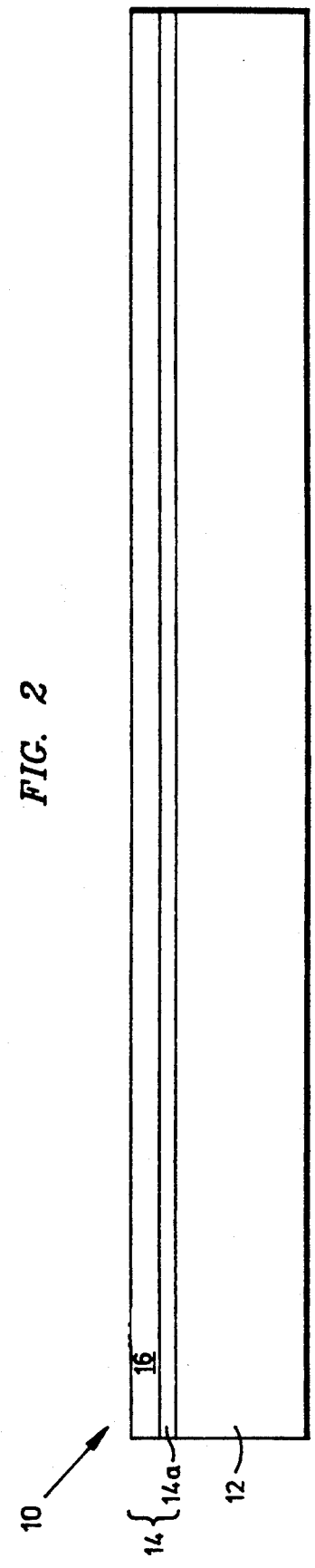

A process embodying various features of the present invention for fabricating complementary depletion and enhancement mode field effect transistors on a single substrate is described with reference to FIG. 1 where there is shown a wafer 10 comprising an insulating substrate 12, preferably comprised of sapphire, on which is grown an unimproved layer 14 of silicon, which by way of example, may be 2700 Å thick. Next, as shown in FIG. 2, silicon layer 14 ion implanted with silicon 15 at 185 keV and at a dose of about $6 \times 10$ cm$^{-2}$ while the temperature of wafer 10 is maintained at $-20°$ C. which makes the bottom half of layer 14 amorphous. The wafer 10 then is placed into a furnace having a nitrogen atmosphere at 550° C. for about 33 minutes. The temperature inside the furnace is ramped from 550° C. to 900° C. over the course of an hour at which temperature the wafer 10 is soaked for about one hour. This temperature treatment allows the regrowth of the amorphous silicon region and forms the improved silicon layer 14a. The nitrogen atmosphere in the furnace is replaced by an O$_2$ atmosphere and the temperature in the furnace is increased from 900° C. to 1000° C. in about 20 minutes. The wafer then is subjected to steam at 1000° C. which thins the improved silicon layer 14a as the oxide grows. The oxide layer 16 is removed from the layer 14a using a buffered oxide etch solution, leaving a thinned improved silicon layer 14a about 1700 Å thick. The wafer 10 is placed in a furnace where the wafer is exposed to an atmosphere of N$_2$ at 875° C. Another oxide layer 18, preferably about 700 Å thick as shown in FIG. 4, is grown over the thinned layer of improved silicon 14a by subjecting the wafer 10 first to a dry oxygen atmosphere and then to steam.

Referring to FIG. 5, islands 20, 22, 24, and 26, each comprised of the remaining oxide layer 18 and improved silicon layer 14a are patterned using standard photolithographic and etching techniques. Upon further processing described herein, island 20 becomes the p-channel enhancement device which uses intrinsic silicon doping to set its threshold voltage. The island 20, therefore, does not receive a threshold adjust implant as the other islands do. The islands 20, 22, 24, and 26 may also be formed by patterning a SIMOX wafer, not shown, in accordance with well known techniques.

As shown in FIG. 6, a layer of photoresist 28 is formed over the wafer 10 and a window 29 is opened to expose the island 22. A p-well is formed in the silicon layer 14a of the island 22 by doping, as for example, by ion implanting a p-type dopant, such as boron (B+), preferably at an energy of about 35 keV with a dose of $3.5 \times 10^{12}$ cm$^{-2}$ to set the n-channel enhancement threshold. Then, the photoresist layer 28 is removed.

Referring to FIG. 7, a photoresist layer 30 is formed over the wafer 10 and a window 31 is opened in the photoresist layer to expose the island 24. The island 24 is doped, as for example, by ion implanting a p-type dopant, such as boron, preferably at an energy level of 35 keV with a dose of about $8.0 \times 10^{12}$ cm$^{-2}$ to set the p-channel depletion threshold in the silicon layer 14a of the island 24. After completion of the p-type dopant implant of the island 24, the photoresist layer 30 is removed. At this point, the oxide layer 18 is removed from all the islands by a buffered oxide etch solution.

Next, as shown in FIG. 8, another photoresist layer 32 is formed over the wafer 10 to cover the islands 20, 22, 24, and 26. A window 33 is opened in the photoresist layer 32 to expose the island 26 which is doped, as for example, by ion implanting an n-type dopant, such as arsenic, at an energy level which may be about 120 keV with a dose of about $4.0 \times 10^{12}$ cm$^{-2}$ to set the n-channel depletion threshold, as described further herein. Then the photoresist layer 32 is removed.

Referring to FIG. 9, an electrically insulating gate layer 34, preferably about 900 Å in thickness, is formed over the surface of the wafer 10. The insulating gate layer 34 may be a thermal oxide layer grown or deposited over the wafer 10. For example, a thermal oxide layer may formed by placing the wafer 10 into a furnace having an N$_2$ atmosphere at 875° C. Then the wafer 10 is exposed to dry O$_2$ to commence oxidation which is completed in steam. The electrically insulating gate layer 34 may also be formed of a nitride deposited over the wafer.

A photoresist layer 37 formed over the wafer 10 and a window 35 is opened in the photoresist layer to expose the islands 20 and 22, which later become the enhancement devices. The electrically insulating gate layer 34 is then etched away from the islands 20 and 22, followed by the removal of the remaining photoresist layer 37 so that the wafer has the structure depicted in FIG. 10. The enhancement devices (formed from islands 20 and 22) have no electrically insulating gate layer 34 on them while the depletion devices (formed from islands 24 and 26) are covered by the electrically insulating gate layer 34 which is approximately 900 Å thick. The wafer 10 is then subjected to a weak hydrofluoric acid etch which removes about 50 Å of the electrically insulating gate layer 34 from islands 22 and 26, leaving the depletion islands with about 850 Å of the electrically insulating gate layer 34 on them.

Referring now to FIG. 11, an electrically insulating gate layer 36, preferably about 250 Å thick, is formed on the islands 20 and 22 (these islands will become the enhancement transistors). This process results in an increase in the thickness of the electrically insulated gate layer 34 formed over the islands 24 and 26 (these islands will become the depletion transistors) from about 850 Å to about 1000 Å. The electrical insulating gate layer 36 may be a thermal oxide layer grown or deposited over the islands 20 and 22, or be formed of a nitride deposited over the island 20 and 22.

Referring to FIG. 12, an electrically conductive material, such as aluminum or tungsten, is deposited over the wafer 10. The electrically conductive material may also include polysilicon deposited over the wafer 10 and doped with phosphorus. The doped electrically conductive material is patterned, or selectively etched so that electrically conductive gates 38 are formed over the relatively thin electrically insulating gate layers 36 on the islands 20 and 22, and over the relatively thicker electrically insulating gate layers 34 formed on the islands 24 and 26.

Figure 13:
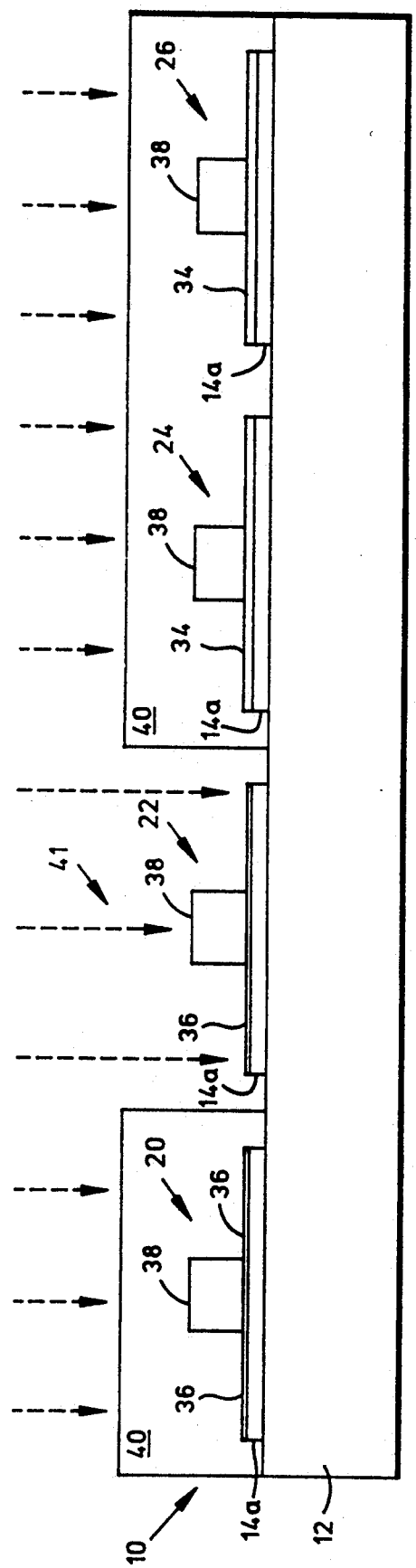

A photoresist layer 40 is formed over the wafer 10, as shown in FIG. 13. A window 41 is opened in the photoresist layer 40 to expose the island 22 which is doped, for example, by ion implanting an n-type dopant, such as arsenic, preferably at an energy of about 45 keV with a dose of about $2 \times 10^{15}$ cm$^{-2}$ to create a self-aligned N+ source/drain for the n-type enhancement device in the improved silicon layer 14a of the island 22. Then the photoresist layer 40 is removed from the wafer 10.

Figure 14:
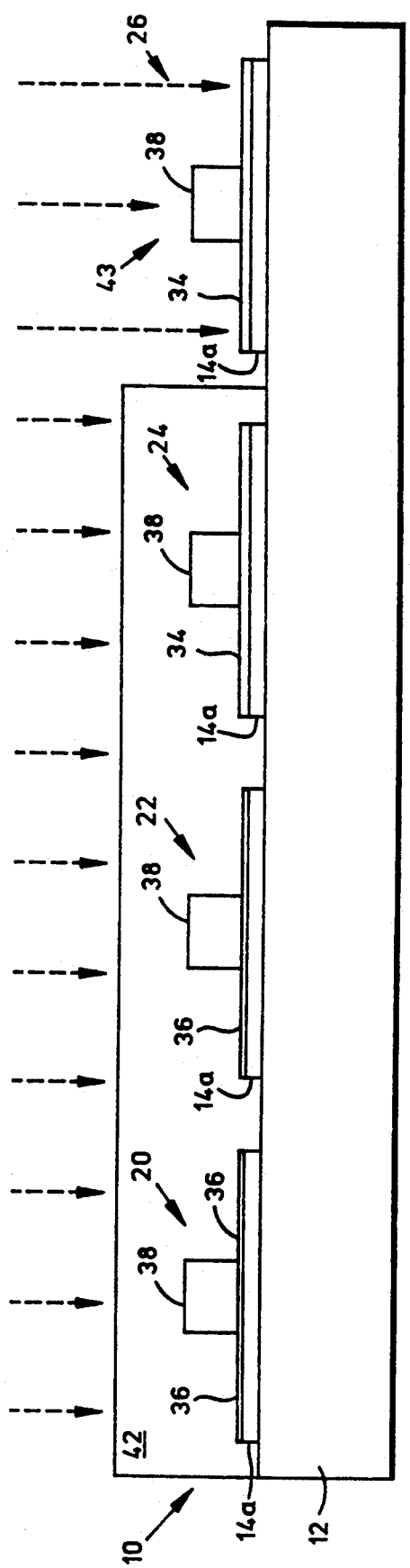

Referring to FIG. 14, a photoresist layer 42 is formed over the wafer 10. A window 43 is opened in the photoresist layer 42 to expose the island 26 which is doped, for example, by ion implanting an n-type dopant, such as arsenic, preferably at an energy of about 110 keV and a dose of about $4 \times 10^{15}$ cm$^{-2}$ to create self-aligned N+ source/drain for the n-type depletion device in the improved silicon layer 14a of the island 26. Then the photoresist layer 42 is removed from the wafer 10.

Figure 15:
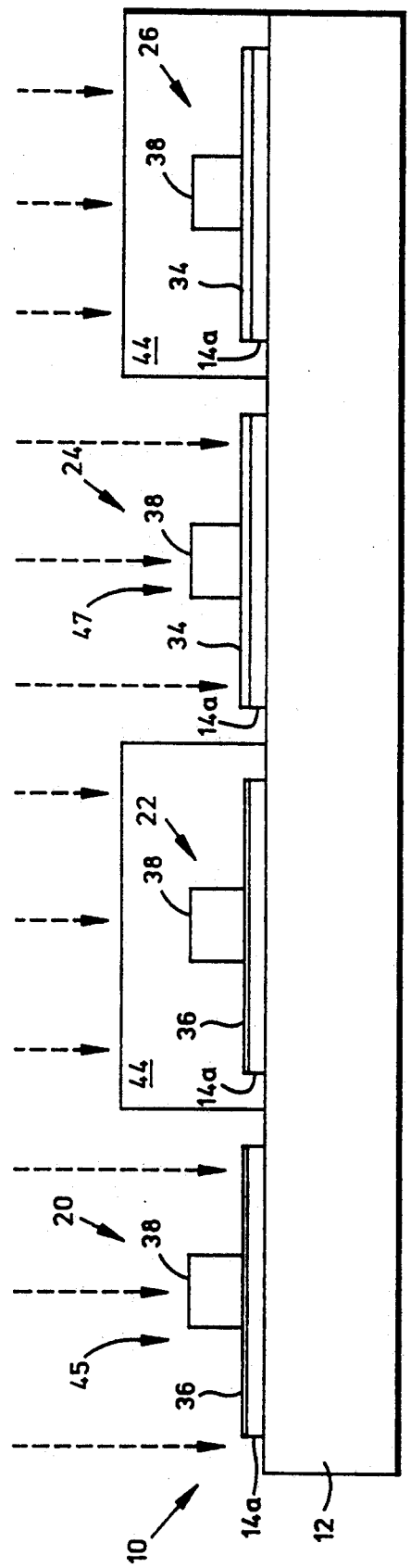

Referring to FIG. 15, a photoresist layer 44 is formed over the wafer 10. Windows 45 an 47 are opened in the photoresist layer 44 to expose the islands 20 and 24, respectively. The islands 20 and 24 are first doped, as for example, by ion implanting a p-type dopant, such as boron, preferably at an energy of about 35 keV and dose of about $1\times 10^{15}$ cm$^{-2}$ to create self-aligned P+ source/drain for the p-type depletion devices in the improved silicon layer 14a of the island 24. Then the islands 20 and 24 are doped, as for example, by ion implanting a p-type dopant, such as BF2, preferably at an energy of about 50 keV at a dose of about $2\times 10^{15}$ cm$^{-2}$. This second doping procedure forms the self-aligned P+ source/drains of what will become the p-type enhancement transistor in the improved silicon layer 14a of the island 20. The temperature of the wafer 10 is preferably maintained at a temperature of about $-15°$ C. while the islands 20 and 24 are being ion implanted. After completion of the doping, the photoresist layer 44 is removed from the wafer 10. The wafer 10 then is annealed in an atmosphere, such as N2, at about 850° C. for 1.0 hour to activate both the channel and source/drain implants of the islands 20, 22, 24, and 26.

Figure 16:
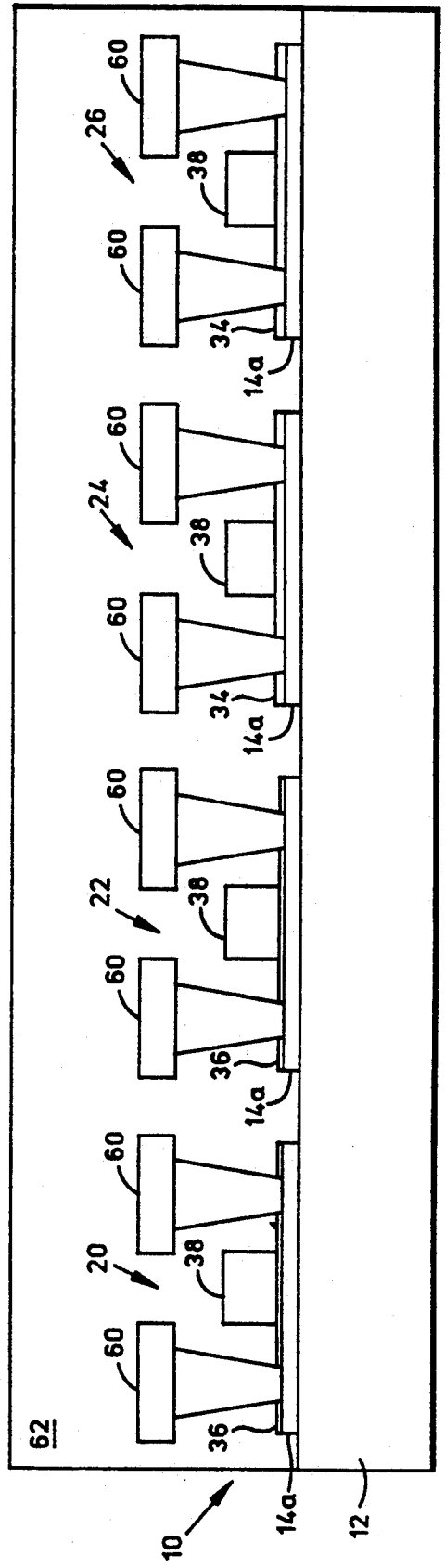

Referring to FIG. 16, annealing the wafer 10, or more specifically the islands 20, 22, 24, and 26, transforms the islands 20 and 22 (hereinafter referred to as FET's 20 and 22), respectively, into p-type and n-type enhancement mode field effect transistors; and transforms the islands 24 and 26 (hereinafter referred to as FET's 24 and 26) into p-type and n-type depletion mode transistors. Metal interconnects 60 may be formed over the source/drain regions of the transistors 20, 22, 24, and 26 using well known techniques in order to interconnect the transistors into useful circuits such as described in U.S. Pat. No. 5,027,171, "Dual Polarity MOS Analog Memory Device," and U.S. Pat. No. 5,097,156, "Compensation Circuitry For Analog Multiplier."

Obviously, many modifications and variations of the present invention are possible in light of the above teachings. For example, any number and/or combination of the individual transistors described above may be manufactured in accordance with the teachings of the present invention. Furthermore, transistors employed in electrical circuits other than those described herein may be manufactured in accordance with the teachings of the present invention. It is therefore to be understood that within the scope of the appended claims, the invention may be practiced otherwise than as specifically described.

We claim:

1. A method for fabricating complementary enhancement and depletion mode field effect transistor on a single substrate, comprising the steps of:
   a) patterning a structure of a layer of silicon formed on an insulating substrate to form first, second, third, and fourth silicon islands to form a wafer;
   b) doping said second island with a p-type dopant;
   c) doping said third island with a p-type dopant;
   d) doping said fourth island with an n-type dopant;
   e) forming a first electrically insulating gate layer on said third and fourth islands;
   f) forming a second electrically insulating gate layer on said first and second island;
   g) forming an electrically conductive gate over said first and second electrically insulating gate layers;
   h) doping said second island with an n-type dopant;
   i) doping said fourth island with an n-type dopant;
   j) doping said first and third islands with a first p-type dopant; and
   k) doping said first and third islands with a second p-type dopant.

2. The method of claim 1 wherein said structure of said layer of said silicon formed on said insulating substrate is formed by:
   a) growing a layer of unimproved silicon on said insulating substrate;
   b) implanting silicon into said unimproved silicon to make said silicon near said substrate amorphous;
   c) annealing said amorphous silicon; and
   d) forming a thinning oxide over said amorphous silicon.

3. The method of claim 1 wherein in step (a), said patterning includes etching said layer of silicon.

4. The method of claim 1 wherein in step (b), said doping includes ion implanting said second island and annealing said wafer.

5. The method of claim 4 wherein said second island is ion implanted with boron at an energy of about 35 keV and at a dose of about $3.5\times 10^{12}$ cm$^{-2}$.

6. The method of claim 1 wherein in step (b), said doping includes ion implanting said third island and annealing said wafer.

7. The method of claim 6 wherein said third island is ion implanted with boron at an energy of about 35 keV and at a dose of about $8.0\times 10^{12}$ cm$^{-2}$.

8. The method of claim 1 wherein in step (d), said doping includes ion implanting said fourth island and annealing said wafer.

9. The method of claim 8 where in said fourth island is ion implanted with arsenic at an energy of about 120 keV and at a dose of about $4.0\times 10^{12}$ cm$^{-2}$.

10. The method of claim 1 wherein in step (e), forming said first electrically insulating gate layer includes forming an oxide layer.

11. The method of claim 10 which includes growing said oxide layer.

12. The method of claim 10 which includes depositing said oxide layer.

13. The method of claim 1 wherein in step (e), forming a first electrically insulating gate layer includes forming a nitride layer.

14. The method of claim 13 which includes depositing said nitride layer.

15. The method of claim 1 wherein in step (f), forming said second electrically insulating gate layer includes forming an oxide layer.

16. The method of claim 15 which includes growing said oxide layer.

17. The method of claim 15 which includes depositing said oxide layer.

18. The method of claim 1 wherein in step (f), forming said second electrically insulating gate layer includes forming a nitride layer.

19. The method of claim 18 which includes depositing said nitride layer.

20. The method of claim 1 wherein in step (g), said electrically conductive gate is formed of a material selected from the group of aluminum, tungsten and polysilicon.

21. The method of claim 1 wherein in step (h), said doping includes ion implanting and annealing said wafer.

22. The method of claim 21 wherein said ion implanting is at an energy level of about 45 keV for arsenic and at a dose of about $2\times 10^{15}$ cm$^{-2}$.

23. The method of claim 1 wherein in step (i), said doping includes ion implanting and annealing said wafer.

24. The method of claim 23 wherein said ion implanting is at an energy level of about 110 keV for arsenic and at a dose of about $4 \times 10^{15}$ cm$^{-2}$.

25. The method of claim 1 wherein in step (j), said doping includes ion implanting and annealing said wafer.

26. The method of claim 25 wherein said ion implanting is at an energy level of about 35 keV for boron and at a dose of about $1 \times 10^{15}$ cm$^{-2}$.

27. The method of claim 1 wherein in step (k), said doping includes ion implanting and annealing said wafer.

28. The method of claim 27 wherein said ion implanting is at an energy level of about 50 keV for BF$_2$ and at a dose of about $2 \times 10^{15}$ cm$^{-2}$.

29. A method for fabricating complementary enhancement and depletion mode field effect transistors on a single substrate, comprising the steps of:
(a) patterning a structure of a layer of silicon formed on an insulating substrate to form first, second, third, and fourth silicon islands to form a wafer;
(b) doping said second island with a p-type dopant;
(c) doping said third island with a p-type dopant;
(d) doping said fourth island with an n-type dopant;
(e) forming a first electrically insulating gate layer on said third and fourth islands;
(f) forming a second electrically insulating gate layer on said first and second islands;
(g) forming an electrically conductive gate over said first and second electrically insulating gate layers;
(h) doping said second island with an n-type dopant at a first energy level and at a first dose;
(i) doping said fourth island with an n-type dopant at a second energy level and at a second dose;
(j) doping said first island with a p-type dopant at a third energy level and at a third does;
(k) doping said third island with a p-type dopant at a fourth energy level and at a fourth dose; and
(l) annealing said wafer to transform said first island into a p-type enhancement mode field effect transistor, said second island into an n-type enhancement mode field effect transistor, said third island into a p-type depletion mode field effect transistor, and said fourth island into an n-type depletion mode field effect transistor.

30. The method of claim 29 wherein in step (h), said n-type dopant is arsenic, said first energy level is about 45 keV and said first dose is about $2 \times 10^{15}$ cm$^{-2}$.

31. The method of claim 29 wherein in step (i), said n-type dopant is arsenic, said second energy level is about 110 keV and said second dose is about $4 \times 10^{15}$ cm$^{-2}$.

32. The method of claim 29 wherein in step (j), said p-type dopant is boron, said third energy level is about 35 keV and said third dose is about $2 \times 10^{15}$ cm$^{-2}$.

33. The method of claim 29 wherein in step (k), said p-type dopant is BF$_2$, said fourth energy level is about 50 keV and said third dose is about $2 \times 10^{15}$ cm$^{-2}$.

34. A method for fabricating complementary enhancement and depletion mode field effect transistors on a single substrate, comprising the steps of:
a) forming a wafer by growing a layer of unimproved silicon on an insulating substrate;
b) ion implanting silicon into said unimproved silicon layer to make said unimproved silicon near said substrate amorphous;
c) annealing said wafer to regrow said layer of amorphous silicon to form a layer of improved silicon;
d) thinning said layer of improved silicon;
e) growing a thin layer of insulating oxide over said layer of improved silicon;
f) selectively etching said thin layer of insulating oxide and said improved layer of silicon to form first, second, third, and fourth islands;
g) ion implanting said second island with a p-type dopant at a first energy level and first dose while masking said first, third, and fourth islands;
h) ion implanting said third island with a p-type dopant at a second energy level and second dose while masking said first, second, and fourth islands;
i) removing said thin layer of insulating oxide from said first, second, third, and fourth islands;
j) ion implanting said fourth island with an n-type dopant at a third energy level and dose while masking said first, second, and third islands;
k) forming a first layer of oxide having a first thickness on said third and fourth islands;
l) forming a second layer of oxide having a second thickness thinner than said first thickness on said first and second islands;
m) forming a polysilicon gate over each said first, second, third, and fourth islands;
n) ion implanting an n-type dopant into said second island at a fourth energy level and fourth dose while masking said first, third, and fourth islands to transform said second island into an n-type enhancement mode field effect transistor;
o) ion implanting an n-type dopant into said fourth island at a fifth energy level and fifth dose while masking said first, second, and third islands to transform said fourth island into an n-type depletion mode field effect transistor; and
p) ion implanting said first and third islands with a p-type dopant at a sixth energy level and sixth dose while masking said second and fourth islands; and
q) ion implanting said first and third islands with a p-type dopant at a seventh energy level and a seventh dose while masking said second and fourth islands to transform said first island into a p-type enhancement mode field effect transistor and to transform said third island into a p-type depletion mode transistor.

* * * * *